United States Patent [19]

Freeouf et al.

[11] Patent Number: 5,049,955
[45] Date of Patent: Sep. 17, 1991

[54] SEMICONDUCTOR BALLISTIC ELECTRON VELOCITY CONTROL STRUCTURE

[75] Inventors: John L. Freeouf, Katonah; Thomas N. Jackson, Peekskill; Peter D. Kirchner, Garrison; Jeffrey Y. Tang, Pleasantville; Jerry M. Woodall, Bedford Hills, all of N.Y.

[73] Assignee: International Business Machines Corporation, Armonk, N.Y.

[21] Appl. No.: 61,036

[22] Filed: Jun. 12, 1987

Related U.S. Application Data

[63] Continuation of Ser. No. 726,858, Apr. 25, 1985.

[51] Int. Cl.$^5$ .................. H01L 29/80; H01L 29/161; H01L 29/72; H01L 29/12
[52] U.S. Cl. ...................................... 357/22; 357/16; 357/34; 357/58; 357/89
[58] Field of Search ...................... 357/16, 34, 58, 89, 357/90, 22

[56] References Cited

U.S. PATENT DOCUMENTS

| 3,691,476 | 9/1972 | Hayashi | 331/94.5 |
|---|---|---|---|
| 3,982,207 | 9/1976 | Dingle et al. | 331/94.5 |
| 4,141,025 | 2/1979 | Bronshtein et al. | 357/26 |
| 4,163,237 | 7/1979 | Dingle et al. | 357/16 |
| 4,173,763 | 11/1979 | Chang et al. | 357/12 |
| 4,194,935 | 3/1980 | Dingle et al. | 148/175 |
| 4,353,081 | 10/1982 | Allyn et al. | 357/22 |
| 4,395,722 | 7/1983 | Esaki et al. | 357/16 |
| 4,396,931 | 8/1983 | Dumke et al. | 357/34 |
| 4,424,525 | 1/1984 | Mimura | 375/23 |
| 4,593,305 | 6/1986 | Kurata et al. | 357/89 |
| 4,649,405 | 3/1987 | Eastman | 357/16 |
| 4,672,404 | 6/1987 | Ankri et al. | 357/34 |
| 4,672,413 | 6/1987 | Gardner | 357/34 |
| 4,686,550 | 8/1987 | Capasso et al. | 357/16 |
| 4,691,215 | 9/1987 | Luryi | 357/16 |
| 4,710,787 | 12/1987 | Usagawa et al. | 357/16 |

FOREIGN PATENT DOCUMENTS

| 0084393 | 7/1983 | European Pat. Off. . |
|---|---|---|
| 92645 | 11/1983 | European Pat. Off. .......... 357/22 A |
| 100456 | 6/1983 | Japan . |
| 2056166 | 3/1981 | United Kingdom .................. 357/12 |

OTHER PUBLICATIONS

N. Yokoyama et al., "Tunneling Hot Electron...", Jap. J. A. P., vol. 23th, 5 May 1984, pp. L311-L312.
R. Malik et al., "Planar Doped Barriers in GaAr by M. B. E.", Electronics Letters, 10/23/80, vol. 16, No. 22, pp. 836–838.
IEEE Electron Device Letters, vol. EDL-7, No. 7, Jul. 1984, "A Tunnelling Emitter Bipolar Transistor", pp. 416–418, to Xu, et al.
IEEE Electron Device Letters, vol. EDL-6, No. 4, Apr. 1985, pp. 178–180, S. Luryi, "An Induced Base Hot-Electron Transistor".
Malik et al., "GaAs Planar-Doped Barrier Transistors Grown by Molecular Beam Epitaxy", 8th Biennial Cornell Elec., Eng. Con., Ithaca, New York, Aug. 11–13, 1981, pp. 87–96.
Mordehai Heiblum, "Tunneling Hot Electron Transfer Amplifiers (Theta): A Proposal for Novel Amplifiers Operating in the Subpicosecond Range". International Electron Devices Meeting, Technical Digest, Wash., D.C., Dec. 8–10, 1980 pp. 629–632.

*Primary Examiner*—Rolf Hille
*Assistant Examiner*—Wael Fahmy
*Attorney, Agent, or Firm*—Pollock, Vande Sande & Priddy

[57] ABSTRACT

A semiconductor device where an emitter material composition and doping profile produces an electron gas in a base adjacent a band offset heterojunction interface, the electrons in the electron gas in the base are confined under bias by a low barrier and the ballistic carriers have their kinetic energy controlled to prevent intervalley scattering by an electrostatic barrier that under influence of bias provides an essentially level conduction band in the portion of the base adjacent the collector.

18 Claims, 2 Drawing Sheets

SEMICONDUCTOR BALLISTIC ELECTRON VELOCITY CONTROL STRUCTURE

This application is a continuation of S.N. 726,858, filed on Apr. 25, 1985.

TECHNICAL FIELD

The present invention is concerned with semiconductor devices that perform amplification with wide band width and switching in the speed range of the order of $10^{-12}$ seconds. In particular, the present invention is concerned with semiconductor transistors of the three terminal type.

BACKGROUND ART

As performance advantages in semiconductor devices are identified, the speed of response in achieving these devices has been limited. Efforts have been undertaken to reduce the dimensions of the devices and to increase the carrier velocity so as to reduce the transit time of the carriers and thereby improve the speed of response. With such efforts, however, have come difficulty in manufacture and serious restrictions on the impressed voltages.

One particularly high-speed device known as a metal base transistor was reported in Proceedings of the IRE, Vol. 50, p. 1527, 1962. The device was composed of two Schottky barrier diodes back-to-back on a metal base.

An improved metal base type structure appeared in the art, as is described in copending patent application S.N. 118,171, filed on Feb. 4, 1980, the disclosure of which is incorporated herein by reference, wherein a two-stage emitter is provided in which, in the first stage, there is a high density of carriers and in the second stage, which is adjacent to a high conductivity base, there is a low barrier. The high conductivity base thickness is of the order of the mean free path of an electron.

A further development in this type of device can be found in U.S. Pat. application S.N. No. 371,849, filed on Apr. 26, 1982 to Solomon, disclosure of which is incorporated herein by reference, wherein the structure employs a field induced layer between two semiconductor regions of the same conductivity type, but of a different conductivity level to serve as a base region. The layer is produced by the field of the operating electrical bias that is applied to the device. The layer thickness is of the order of the mean free path of an electron so that ballistic-type transport is achieved.

A most recent development in this type of device is reported in IEEE Electron Device Letters Vol. EDL-6, No. 4, Apr. 1985, p. 178 wherein there is described a structure in which a base conductivity is induced by the collector field.

The structures in this type of device heretofore in the art exhibit less than optimum performance due to low current or voltage gain and low electron velocity during transit from the emitter to collector.

DISCLOSURE OF THE INVENTION

Figure 1:
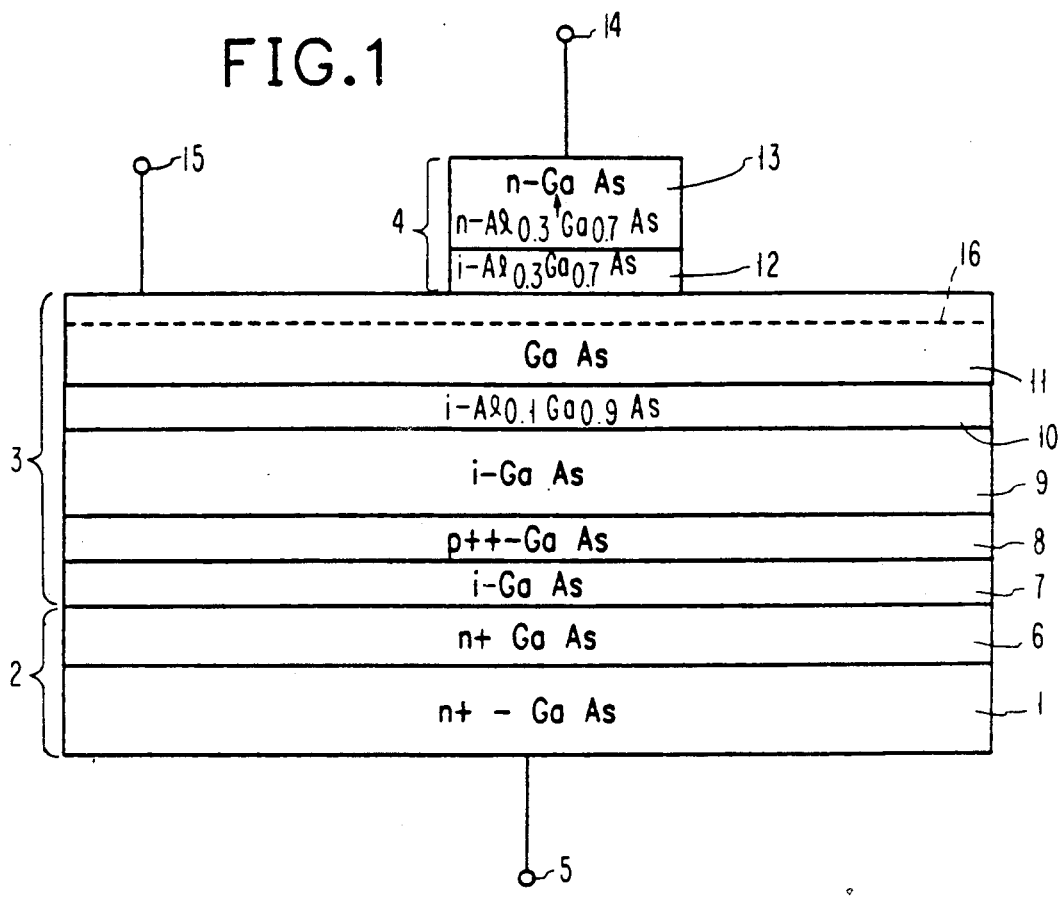
FIG. 1 is a schematic illustration of a three terminal device embodiment of the invention.

While the invention will be described using the specific materials gallium arsenide (GaAs) and aluminum gallium arsenide (AlGaAs), specific n or p conductivity type, and specific donor or acceptor carrier type, in the light of the principles set forth, material, conductivity, and carrier-type substitutions will be readily apparent to one skilled in the art.

In ballistic type devices, the carriers traverse a portion of the device, usually the base, while avoiding significant loss of both energy and velocity by various mechanisms. Such devices require an injecting emitter function for injecting carriers with high energy and high velocity, which in turn is the lowest effective mass, across a base function toward a collector function. The base function is used to control the number of carriers injected by the emitter. The collector function ideally provides efficient collection of the high velocity carriers injected by the emitter that successfully retain most of their velocity upon traversing the base.

The most significant velocity loss mechanism of high energy electrons in GaAs at low temperature is intervalley scattering, which occurs in substantially less than 0.1 picoseconds when the electron's energy exceeds about 0.3 electron volts (eV). In order to maintain high velocity electron transport, either the electrons must transit the base in less time than is required for intervalley scattering which in turn would necessitate a total base thickness below about 10 nanometers, or the electron must be maintained at an energy that is below the energy for such intervalley scattering which is below the satellite, large effective mass conduction band valleys of the particular material which in this illustration is GaAs.

The invention provides a number of features useful in ballistic type devices in various combinations as well as in combination in a three terminal device.

The invention incorporates a base to emitter heterojunction where electron injection is controlled by a two-dimensional electron gas that occurs within the base near the emitter.

A low-energy barrier is positioned between the two-dimensional electron gas and the collector. The barrier is incorporated to prevent the control charge which is the 2-D electron gas from flowing to the collector under bias while also being low enough to permit the high energy, high velocity electrons from the emitter to pass to the collector with minimal quantum mechanical reflection and little net velocity loss. This low energy barrier may be provided by compositional grading or by planar doped barrier means. For purposes of simplicity in communication, the compositional type barrier will be described. An additional doping produced barrier similar to the planar doped type of barrier as described in Electron Letters, Vol. 16, No. 22 (1980), p.836-8 is incorporated in the base to allow a relatively large collector to base bias to be applied while maintaining desirable high velocity electron transport across the base.

These features permit a ballistic type device to retain the response advantages yet be able to operate others of its type in high-speed circuits.

Referring to FIG. 1, a three terminal semiconductor structure incorporating the principles and features of the invention is schematically illustrated. The structure of FIG. 1 includes a semiconductor substrate 1, a collector 2, a base 3, and an emitter 4. For purposes of facilitating explanation, n conductivity type will be used in the description with higher and lower conductivity being shown as + or − and i being used to indicate intrinsic.

The substrate 1 serves the function of an ohmic contact to the collector 2 and is connected to an external electrical connection 5. The substrate 1 is shown schematically, can be part of a larger supporting structure not shown, can include a buffer layer and is n+doped GaAs. The collector 2 comprises the substrate 1 and an n+GaAs epitaxial layer 6 grown on the substrate 1. The layer 6 is doped to about $10^{18}$ atoms/cc and is about 0.1 to 1.0 micron thick.

Continuing with the structure of FIG. 1, an intrinsic or undoped GaAs layer 7 is epitaxially grown on the n+GaAs layer 6. This intrinsic GaAs layer 7 is usually about 50 to about 250 angstroms thick, and preferably about 100 angstroms.

Continuing further, epitaxial with the opposite face of the intrinsic gallium arsenide layer 7, an epitaxial p++GaAs layer 8 is grown. This p++GaAs region 8 is about 10 to 30 angstroms thick; and preferably about 20 angstroms thick. The concentration of the p type dopant in this layer is chosen to produce a sheet charge density of approximately $10^{12}$ negative charges per square cm.

Further continuing with the structure of FIG. 1 on the face of the p++gallium arsenide region 8 that is opposite to layer 7 there is grown an intrinsic or undoped epitaxial gallium arsenide region 9 of about 800 to about 1200 angstroms thick, preferably about 1000 angstroms.

Still further in FIG. 1, on the face of the intrinsic gallium arsenide layer 9 opposite to layer 8 is grown an intrinsic $Al_xGa_{1-x}As$ layer 10 with compositional variation such that the value of x varies from 0.1 to 0.0 symmetrically about a midpoint. This layer 10 is about 100 angstroms thick.

Still continuing with the structure of FIG. 1, on the layer 10, a layer 11 of gallium arsenide about 100 angstroms thick is grown. The layer 11 is substantially undoped, in that it contains no more than about $10^{15}$ dopant atoms per cm$^3$.

The layer 12 of FIG. 1 is epitaxially grown on the opposite face of layer 11 from layer 10 of undoped $Al_{0.3}Ga_{0.7}As$ about 100 angstroms thick.

The final layer of FIG. 1 is layer 13. In growing layer 13 on layer 12, a n type carrier concentration of about $10^{18}$ cm$^3$ is added and in addition, Al component of the composition of layer 13 is gradually reduced to 0 or pure GaAs in a distance of about 2000 angstroms.

In the structure of FIG. 1, layers 12 and 13 constitute the emitter designated as 4.

The ohmic contact 14 to emitter 4 is made and the contact is then used to define the area to be etched to expose an area of layer 11 for the base contact. The layer is etched back to the vicinity of the GaAs layer 11 and an alloyed ohmic contact 15 is made to serve as the external base electrode. A suitable contact is an alloyed Sn contact, as disclosed in U.S. Pat. No. 4,379,005 to Hovel and Woodall, disclosure of which is incorporated herein by reference. Such an alloyed Sn contact forms a blocking or rectifying contact to the AlGaAs in layers 10 and 12, but an ohmic contact to the GaAs in layer 11.

Although the above description refers to a combination of GaAs and AlGaAs, other such combinations for example are Ge and AlGaAs; Ge and GaAs; InSb and CdTe; GaAs and InGaAs.

Example dopants of n-type for GaAs include silicon and tin. Example dopants of p-type for GaAs include beryllium and magnesium.

The base 3 is made up of layers 7, 8, 9, 10 and 11 which in combination functionally provide an n+-i-p++-i-n+structure. The structure of the invention has a number of unique features. One feature of the structure of this invention is that the n+structure proximate the emitter is derived from the electron transfer from the doping of the emitter into the region 11. Another feature of the structure of this invention is the region 10 which acts as a barrier to electron flow from the base to the collector when there is bias between the emitter and the collector. A further feature is that under emitter to collector bias the planar barrier structure in the base 3 of layers 7 through 11 acts to maintain constant electron kinetic energy as electrons traverse through the base 3.

It should be noted that in contrast to the usual base regions employed in structures in the art which require either doping or bias to induce conductivity; the emitter structure 4 in accordance with the invention give rise to a nearby 2-dimensional electron gas that serves as that part of the base providing emitter bias.

The electrons in the doped AlGaAs layer 13 will transfer through layer 12 into the GaAs layer 11, producing an accumulation layer 16. The means for providing this accumulation layer can be referred to as a conduction band offset means.

The AlGaAs composition in regions 12 and 13 is selected such that in service as an emitter the electrons are injected into the GaAs layer 11 with an energy nearly, but not over, that required to transfer to a high-effective-mass satellite conduction band valley. The electrons will thus have a low effective mass and, hence, a high velocity. With the structural features of the invention, the electrons are launched with the proper velocity and are caused to retain that velocity by the interrelated quantum mechanical elements placed in the base 3.

A key feature of the performance of the device is a dual function of the base 3. First, a part of the base 3 employs a planar-doped type barrier structure. This type of barrier may be considered electrostatic in nature in that in a zero bias condition the barrier causes the Fermi level to be in a position that when the device is placed under operating bias, the Fermi level is in the optimal location. Such a barrier is of the planar doping type in the art where a narrow high conductivity level is introduced. In accordance with the invention, this type of barrier is constructed as layer 8 in the base 3 adjacent to the collector 2 so that the applied bias voltages will not cause the ballistic electrons to gain too much energy or they will transfer to the satellite conduction band valleys and slow considerably due to a large increase in their effective mass. Thus, a unique aspect of the invention is the quantum mechanical feature of the barrier that permits the ballistic electrons to have sufficient energy for performance but prevents acquisition of enough energy for intervalley scattering for appropriate biasing.

The planar-doped barrier provided in the structure of the invention is an n+-i-p++-i-n+structure made with i regions of unequal thickness and a p++ region thin enough so that there are no free holes. The conduction band profile through the device has a maximum at the p++region which in turn forms a barrier to electron flow. In service in the device of the invention, the planar-doped barrier uses the two-dimensional electron gas 16 in the base 3 adjacent the emitter interface as the first n+region.

A second feature of the base is the low barrier that confines carriers in the potential well in region 16 adjacent the emitter base interface. This barrier is produced by layer 10 which prevents low energy electrons from the two dimensional electron gas from reaching the collector despite high emitter to collector bias.

As a result of layer 10, a collector to base voltage rear the band gap of GaAs, about 1.5V, can be applied before significant conduction between the electron gas and the collector region occurs.

With barriers of both electrostatic and compositional type, precise quantum mechanical conditions under operating bias can be produced in semiconductor structures. Smaller but precise barriers such as setting thresholds for conduction and band offset potential well confinement can be provided by bias independent compositional barriers and these can be used with higher but bias sensitive electrostatic barriers.

BEST MODE FOR CARRYING OUT THE INVENTION

Figure 3:
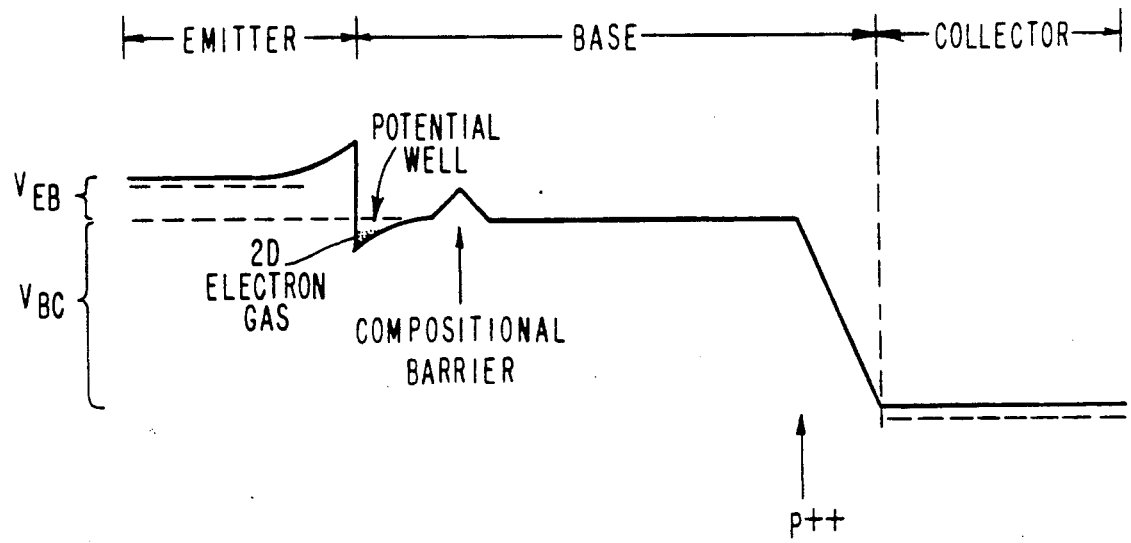
FIG. 3 is a dimensionally correlated band energy diagram of the regions of the device of FIG. 1 under the influence of biasing.
Figure 2:
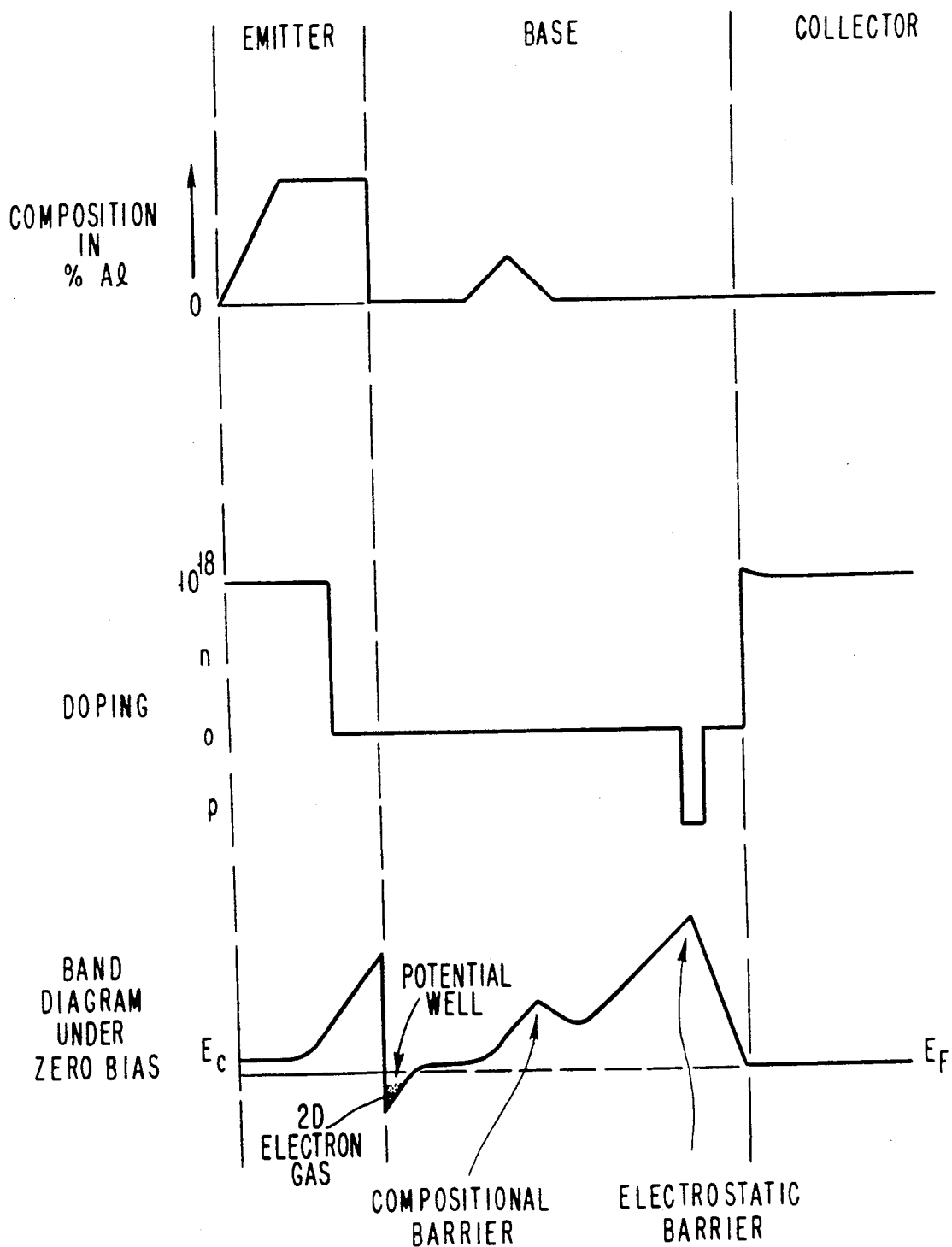
FIG. 2 is a dimensionally correlated set of diagrams of composition, doping and zero bias band energy of the structure of FIG. 1.

Referring again to the drawings, dimensionally correlated graphs of the composition, doping and band energy at zero bias of the structure of FIG. 1 are shown in FIG. 2. The conduction band profile of the structure of FIG. 1 during operation is shown in FIG. 3.

Referring to FIG. 2, with respect to the percentage of Al introduced into GaAs in the emitter and for the low compositional barrier in the base is shown. Considering the structure as it is grown from the collector toward the emitter, the Al is introduced in the region 10 and in the emitter region 12 with grading by reduction to 0 in region 13.

With respect to doping, again considering growth beginning with the collector region, the n doping in layer 6 at about $10^{18}$ atoms/cc is reduced to zero at the collector interface between layers 6 and 7. There is a growth of undoped material followed by a sharp p dopant quantity or spike which produce the p++layer 8. The material then remains undoped during growth through layer 12 until the layer 13 is formed.

The composition and dopant configurations as shown in FIG. 2 produce in the structure of FIG. 1 the energy band situation at zero bias as shown in FIG. 2 wherein the p++region 8 produces a planar doped or electrostatic barrier in the base adjacent to the collector, and the Al introduction in layer 10 produces the compositional barrier. Further, the Al$_{0.3}$Ga$_{0.7}$As emitter region graded to GaAs in the region 13 produces a large carrier supply in the emitter with a narrow barrier which provides a ballistic electron launcher or injector. Still further, the combination of doping and aluminum profile in the emitter acts to form the 2-dimensional electron gas in the potential well adjacent the emitter interface.

Referring next to FIG. 3 which illustrates the band energy of the device under the influence of operating bias voltages. The operating bias voltage are is such that with respect to the collector there is small positive bias between the emitter and base regions and a larger positive bias on the collector with respect to the base.

The emitter to base bias voltage is of a polarity to inject electrons onto the base. The collector to base bias is sufficient to maintain a nominally flat conduction band profile throughout layer 9, which acts to maintain constant kinetic energy of electrons traversing the base region, while at the same time it does not affect the compositional barrier to prevent electrons of the electron gas in the potential well in layer 11 from reaching the collector.

Thus, the present invention offers sub-picosecond response and precisely determined threshold or turn-on voltages. At 77 degrees Kelvin temperature the electron gas that forms in the base adjacent the emitter interface has a very high conductivity despite its about 100 angstrom width. At low temperatures, a large majority of the electrons injected by the emitter can be expected to reach the collector contact, leading to large current gains.

In operation, the injected current "turns on" strongly near an emitter to base voltage of 0.3V and base to collector voltages near 1.5V are possible without limiting control of the injected current.

One skilled in the art in fabricating a device with the specifications employed in this invention would conveniently select the well-known technique of molecular beam epitaxy (MBE) since the technique permits fabrication to small dimensions and the temperatures employed are not so high as to move the impurities significantly. The MBE technique has been available for a number of years and it enables one skilled in the art to grow in an eptiaxial manner semiconductors with thicknesses as small as around 20 angstroms and to produce sharp boundaries of the order of 5 angstroms.

The fabrication of contacts to the various electrodes is done employing standard photolithographic processes.

What has been described is a semiconductor ballistic electron velocity control structure wherein quantum mechanical conditions are provided in regions of the structure that provide optimum performance conditions for the carriers under operating bias.

Having thus described our invention, what we claim as new and desire to secure by Letters Patent is:

1. In a compound semiconductor structure of the type where carriers in a semiconductor crystal material are launched from an emitter for ballistic transport across a base to a collector, the improvement for controlling the kinetic energy gained by the ballistic transport carriers comprising a first barrier in said base adjacent said emitter and a planar doped type barrier in said base adjacent said collector, said first barrier and said planar doped type barrier operable to provide an essentially level conduction band profile across the base of the semiconductor structure between the two carriers under suitable bias voltages.

2. The structure of claim 1 where said base semiconductor material comprises GaAs layers and said planar doped barrier is a narrow p++type region.

3. In a semiconductor structure having an emitter, a base and a collector, and wherein carriers are transported under the influence of biasing voltages, the improvement comprising the combination of at least one voltage biased compositional barrier located in the base adjacent the emitter and at least one voltage biased electrostatic barrier located in the base and interposed between the compositional barrier and the collector.

4. The structure of claim 3 wherein said compositional barrier is AlGaAs and said electrostatic barrier is p conductivity type.

5. The structure of claim 4 wherein said AlGaAs barrier has a first barrier energy level and said p type has a second barrier energy level higher than that of the AlGaAs barrier.

6. A compound semiconductor device of the type having multiple valley regions and where the carriers can be in one or other mass states, the semiconductor device further having an emitter element, a base element and a collector element, one side of the base element being contiguous with the collector element, the other side of said base element being contiguous with said emitter element for forming a heterojunction, the improvement comprising:

said emitter element
having a high carrier density portion adjacent an external electrode and
having a second portion for forming a specific barrier height located adjacent said heterojunction with said base element, said second portion having a first band gap;

said base element
having a second band gap smaller than said first band gap of said emitter element;
having means for confining low energy carriers from the emitter element in a potential well adjacent said heterojunction,
having means adjacent said collector element operable to confine ballistic carriers to low effective mass to prevent the ballistic carriers from transferring to a high effective mass satellite conduction band valley of the semiconductor, and
having an external electrode;

said collector element
having a high conductivity portion, and
having an external electrode.

7. The device of claim 6 wherein said carrier confining means and said low effective mass confining means are respective voltage biased barriers.

8. The device of claim 7 wherein said carrier confining barrier is effected by a localizing change in band gap due to a change in semiconductor composition and said low effective mass confinement means is a planar doped barrier.

9. The device of claim 8 wherein said semiconductor is GaAs and said composition change is produced by the addition of Al.

10. The device of claim 7 wherein said carrier confinement barrier is a planar doped barrier and said low effective mass confinement means is a planar doped barrier.

11. The device of claim 10 where said semiconductor is GaAs.

12. The device of claim 9 wherein said emitter element is n type and graded from GaAs adjacent said external electrode to intrinsic AlGaAs, said heterojunction being adjacent to said intrinsic AlGaAs, and wherein said base element is undoped GaAs adjacent said second junction.

13. The device of claim 12 wherein said carrier confining means is a region of AlGaAs.

14. The device of claim 13 wherein said AlGaAs portion of said emitter element is $Al_{0.3}Ga_{0.7}As$ and said carrier confining means is $Al_{0.1}Ga_{0.9}As$.

15. A semiconductor device having a collector portion, a base portion, and an emitter portion, a potential well formed in the base portion adjacent the emitter portions, the device comprising:

a degenerative two-dimensional carrier gas layer in the potential well;
a layer between said gas layer and said collector portion for providing a low energy barrier to confine low energy electrons traveling from said emitter portion to said collector portion in said potential well under a bias voltage; and
a planar doped type barrier between said low energy barrier layer and said collector portion
for permitting ballistic carriers to transport from said emitter portion to said collector portion, but preventing the same from acquiring enough energy for intervalley scattering.

16. The semiconductor device of claim 15 wherein said second layer is intrinsic AlGaAs.

17. In a semiconductor three-terminal structure of the type where carriers in a semiconductor crystal material are launched from an emitter for transport across a base to collector, each of said emitter, base, and collector having electrode means connected thereto, said semiconductor structure comprising:

a potential well adjacent said emitter;
a low energy barrier between said potential well and said collector confining low energy carriers transversing from said emitter to said collector in said potential well under a bias voltage; and
a planar doped type barrier interposed between said low energy barrier and said collector for permitting ballistic carriers to traverse from said emitter to said collector without said carriers losing substantial energy and velocity.

18. The semiconductor structure of claim 17 wherein said low energy barrier is a compositional barrier and wherein said planar doped type barrier is an electrostatic barrier.

* * * * *